(12) United States Patent
Higgins, III

(10) Patent No.: US 9,269,648 B2
(45) Date of Patent: Feb. 23, 2016

(54) THERMALLY ENHANCED PACKAGE WITH LID HEAT SPREADER

(71) Applicant: Leo M. Higgins, III, Austin, TX (US)

(72) Inventor: Leo M. Higgins, III, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/560,678

(22) Filed: Dec. 4, 2014

(65) Prior Publication Data

US 2015/0145114 A1    May 28, 2015

Related U.S. Application Data

(62) Division of application No. 13/617,851, filed on Sep. 14, 2012, now Pat. No. 8,921,994.

(51) Int. Cl.
| | |
|---|---|
| *H01L 23/48* | (2006.01) |
| *H01L 23/10* | (2006.01) |
| *H01L 21/00* | (2006.01) |
| *H01L 23/367* | (2006.01) |

(Continued)

(52) U.S. Cl.
CPC .......... *H01L 23/3675* (2013.01); *H01L 21/561* (2013.01); *H01L 21/565* (2013.01); *H01L 23/4334* (2013.01); *H01L 24/13* (2013.01); *H01L 24/81* (2013.01); *H01L 24/83* (2013.01); *H01L 24/97* (2013.01); *H01L 24/85* (2013.01); *H01L 2224/13147* (2013.01); *H01L 2224/2919* (2013.01); *H01L 2224/45565* (2013.01); *H01L 2224/48091* (2013.01); *H01L 2224/73204* (2013.01); *H01L 2224/73215* (2013.01); *H01L 2224/73253* (2013.01); *H01L 2224/73265* (2013.01); *H01L 2224/83191* (2013.01); *H01L 2924/12042* (2013.01); *H01L 2924/181* (2013.01)

(58) Field of Classification Search
CPC ... H01L 21/565; H01L 23/4334; H01L 24/97; H01L 21/561; H01L 23/3675; H01L 2224/73265; H01L 24/13; H01L 24/81; H01L 24/83; H01L 2224/48091; H01L 2224/73215; H01L 2924/0665; H01L 2224/2919; H01L 2224/13147; H01L 2924/12042
USPC ............. 257/692, E23.08, 738, 706; 438/113
See application file for complete search history.

(56) References Cited

U.S. PATENT DOCUMENTS

| | | |
|---|---|---|
| 5,409,865 A | 4/1995 | Karnezos |
| 5,909,056 A | 6/1999 | Mertol |

(Continued)

OTHER PUBLICATIONS

D. Retuta et al., Thermal Performance Enhancement for CSP Packages, IEEE Electronic Components and Technology Conference, May 29, 2007-Jun. 1, 2007.

(Continued)

*Primary Examiner* — Long K Tran
*Assistant Examiner* — Dzung Tran
(74) *Attorney, Agent, or Firm* — Terrile, Cannatti, Chambers & Holland, LLP; Michael Rocco Cannatti

(57) ABSTRACT

A method and apparatus are provided for manufacturing a lead frame based thermally enhanced package (9) with exposed heat spreader lid array (96) designed to be optimized for compression mold encapsulation of an integrated circuit die (94) by including a perimeter reservoir regions (97r) in each heat spreader lid (96) for movement of mold compound (98) displaced during the mold compression process.

20 Claims, 6 Drawing Sheets

(51) Int. Cl.
  *H01L 23/433* (2006.01)
  *H01L 21/56* (2006.01)
  *H01L 23/00* (2006.01)

(56) References Cited

U.S. PATENT DOCUMENTS

| | | | |
|---|---|---|---|
| 5,977,626 A | 11/1999 | Wang et al. | |
| 5,990,552 A | 11/1999 | Xie et al. | |
| 6,258,624 B1 | 7/2001 | Corisis | |
| 6,432,742 B1 | 8/2002 | Guan et al. | |
| 6,432,749 B1 | 8/2002 | Libres | |
| 6,562,655 B1 | 5/2003 | Glenn et al. | |
| 6,734,552 B2 | 5/2004 | Combs et al. | |
| 6,737,755 B1 | 5/2004 | McLellan et al. | |
| 6,784,535 B1 | 8/2004 | Chiu | |
| 6,800,948 B1 | 10/2004 | Fan et al. | |
| 6,882,041 B1 | 4/2005 | Cheah et al. | |
| 6,924,170 B2 | 8/2005 | Ravi et al. | |
| 6,933,176 B1 | 8/2005 | Kirloskar et al. | |
| 6,967,126 B2 | 11/2005 | Lee et al. | |
| 6,977,188 B2 | 12/2005 | Takase | |
| 6,979,594 B1 | 12/2005 | Fan et al. | |
| 7,153,725 B2 | 12/2006 | Wang et al. | |
| 7,180,173 B2 | 2/2007 | Kuo et al. | |
| 7,259,445 B2 | 8/2007 | Lau et al. | |
| 7,259,448 B2 | 8/2007 | Zhang et al. | |
| 7,432,130 B2 | 10/2008 | Ismail et al. | |
| 7,741,158 B2 | 6/2010 | Leung et al. | |
| 7,790,510 B1 | 9/2010 | Zhang | |
| 7,898,093 B1 | 3/2011 | Darveaux et al. | |
| 7,998,791 B2 | 8/2011 | Chong et al. | |
| 8,012,799 B1 | 9/2011 | Ibrahim et al. | |
| 8,156,998 B2 | 4/2012 | Furman et al. | |
| 2002/0084518 A1* | 7/2002 | Hasebe et al. | 257/676 |
| 2003/0067069 A1 | 4/2003 | Lebonheur et al. | |
| 2003/0106212 A1 | 6/2003 | Chao et al. | |
| 2003/0127714 A1* | 7/2003 | Behun et al. | 257/675 |
| 2004/0188829 A1 | 9/2004 | Hu et al. | |
| 2006/0202313 A1* | 9/2006 | Tan et al. | 257/676 |
| 2006/0231944 A1* | 10/2006 | Huang et al. | 257/706 |
| 2006/0270116 A1 | 11/2006 | Dangelo | |
| 2007/0075404 A1* | 4/2007 | Dimaano et al. | 257/666 |
| 2007/0122943 A1 | 5/2007 | Foong et al. | |
| 2007/0178626 A1 | 8/2007 | Ismail et al. | |
| 2007/0200225 A1 | 8/2007 | Ibrahim et al. | |
| 2007/0235859 A1 | 10/2007 | Espiritu et al. | |
| 2009/0219698 A1 | 9/2009 | Chao | |
| 2010/0014254 A1 | 1/2010 | Fukuzono et al. | |
| 2010/0323465 A1 | 12/2010 | Leung et al. | |
| 2011/0012257 A1 | 1/2011 | Eu et al. | |
| 2011/0024906 A1 | 2/2011 | Meyer et al. | |

OTHER PUBLICATIONS

Partial European Search Report for EP Application No. 13183374.1, dated Dec. 12, 2013.

* cited by examiner

THERMALLY ENHANCED PACKAGE WITH LID HEAT SPREADER

CROSS-REFERENCE TO RELATED APPLICATIONS

This application is a divisional of co-pending application Ser. No. 13/617,851, filed Sep. 14, 2012, which is incorporated herein by reference in its entirety.

BACKGROUND OF THE INVENTION

1. Field of the Invention

This invention relates to integrated circuit packages and a method of manufacturing same. In one aspect, the present invention relates to an integrated circuit package having an exposed lid heat spreader.

2. Description of the Related Art

As the density and complexity of integrated circuit devices increases and the size of such devices shrinks, significant challenges are posed in the design and packaging of these devices. One challenge is to provide a thermal path within the package to conduct heat away from the integrated circuit die, where conventional approaches for removing heat generated within the package typically use individual metal lids or heat spreaders that are separately applied to individual packaged units and then encapsulated with molding compound. The use of individual lids is not efficient for the manufacture of multiple integrated circuits in terms of the separate application requirements for separate heat spreaders and also in forcing the use of a larger body size to allow room beyond the edge of the lid for saw singulation. Further, such packages typically have a relatively high thermal resistance between the die junction surface and the heat spreader, especially when mold compound is formed therebetween. Such conventional approaches also present packaging reliability challenges caused by overheating resulting from poor thermal transfer from the integrated circuit die.

Accordingly, a need exists for an improved integrated circuit chip package and manufacture method that addresses various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
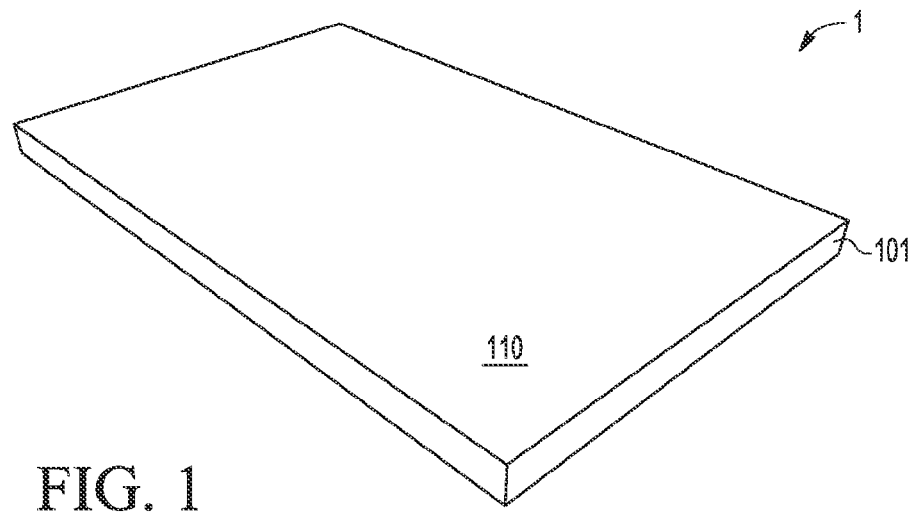
FIG. 1 illustrates a perspective view of a copper sheet used to form an array of lid heat spreaders for use in compression mold packaging.

A method and apparatus are described for fabricating integrated circuit chips with low profile thermally enhanced compression mold packages (e.g., flip chip or ball grid array packages) with exposed heat spreader lids that are formed as an array of stamped or etched metal or other thermally conductive material which makes direct thermal contact with the integrated circuit chips which are encapsulated with compression molding compound prior to singulation. In selected embodiments, the heat spreader lid array eliminates the need for a lower mold cavity tool by providing a container for mold compound that seals the lid array to the substrate without requiring an adhesive. As formed, the heat spreader lid array includes recessed pedestal structures and surrounding pedestal recess areas which are suitable for wire bond and flip ship assemblies. The heat spreader lid arrays may also be formed with reduced metal in the intended saw singulation lines by forming recessed lid feet structures to facilitate saw singulation. In addition, the heat spreader lid arrays may be formed to include a perimeter reservoir region that is optimized so as to allow the mold compound to flow into the perimeter reservoir region during compression molding to provide the seal of the lid to substrate.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified perspective and cross sectional drawings of an integrated circuit package during various stages of fabrication without including every device feature or geometry in order to avoid limiting or obscuring the present invention. In addition, certain elements in the figures are illustrated for simplicity and clarity and have not necessarily been drawn to scale. It is also noted that, throughout this detailed description, certain layers of materials will be deposited, removed and otherwise processed to form the depicted packaging structures with exposed heat spreader lids. Where the specific procedures for forming such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention.

Referring now to FIG. 1, there is shown a perspective view of a thermally conductive layer 1 of metal or other thermally conductive material that is used to form an array of lid heat spreaders for use in compression mold packaging. In selected example embodiments, the layer may be formed from a copper sheet 101 having a predetermined thickness (e.g., approximately 285 um) and an upper surface 110 in which selected recesses and openings will be defined using etching, stamping, or machining processes to form the heat spreader lid array.

Figure 2:
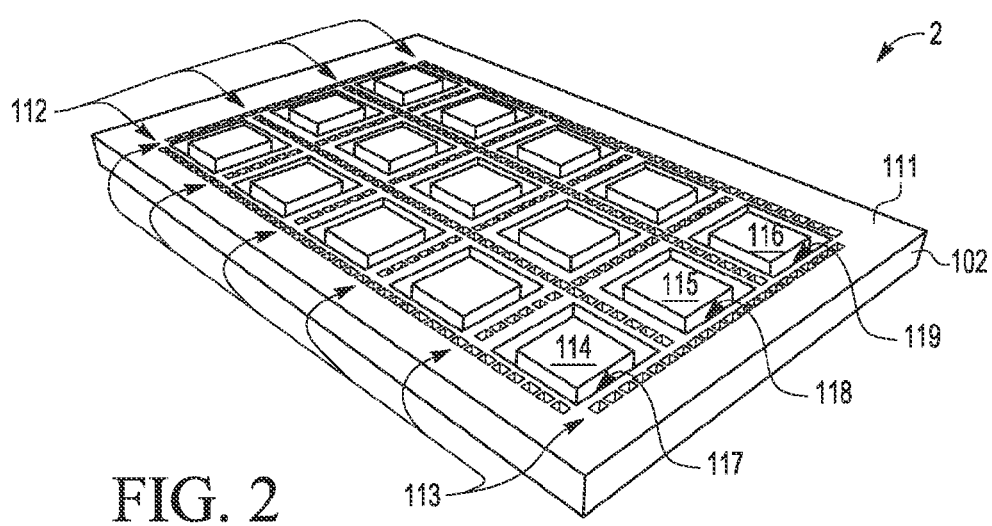
FIG. 2 illustrates a perspective view of the copper sheet shown in FIG. 1 after a stamp or selective etch process is applied to define a heat spreader array structure with pedestal recesses and saw singulation recesses around each pedestal area.

FIG. 2 illustrates a perspective view of the heat spreader array structure 2 shown in FIG. 1 after an array of pedestals (e.g., 114-116) and cavities in the surrounding saw singulation regions (112, 113) are defined in the upper surface 111 of the thermally conductive layer 102. As shown, the heat spreader array structure 2 may be produced by machining, stamping, or etching a portion of the lid layer 102 (e.g., copper or copper alloy) to define a predetermined pattern of recessed lid array features (e.g., die contact flags or pedestals 114-116, pedestal recess openings 117, 119, saw singulation recesses 112-113, etc.). For example, a first etch process may be applied to a patterned etch mask layer of photoresist formed on the upper surface 111 of the lid layer 102, where the etch process is controlled to partially etch pedestal recess openings (e.g., 117-119) and saw singulation recess openings (e.g., 112-113) through the lid layer 102. The pedestal recess openings (e.g., 117-119) are defined by a lateral dimension (between the unetched outer lid feet and inner pedestal structures) and a depth dimension (between the unetched top surface and the bottom of the pedestal recess), and provide a recess around each pedestal in which a wire bond conductor may extend. As will be appreciated from the description herein, the lateral dimension of the pedestal recess opening determines the extent to which the finally-formed pedestal overlaps with the integrated circuit die. While the saw singulation recess openings (e.g., 112) are shown as being formed with a criss-crossing pattern of separate, partially etched recess openings that are aligned along an intended saw singulation cut line, it will be appreciated that the saw singulation recess openings may be formed with a criss-crossing pattern of single, partially etched recess openings that are formed in alignment with the intended saw singulation cut line. In other words, a plurality of separate, partially etched recess openings along a singulation cut line are effectively combined into a single, partially etched opening along the singulation cut line, thereby reducing the amount of thermally conductive material that must subsequently be cut or sawed.

Figure 3:
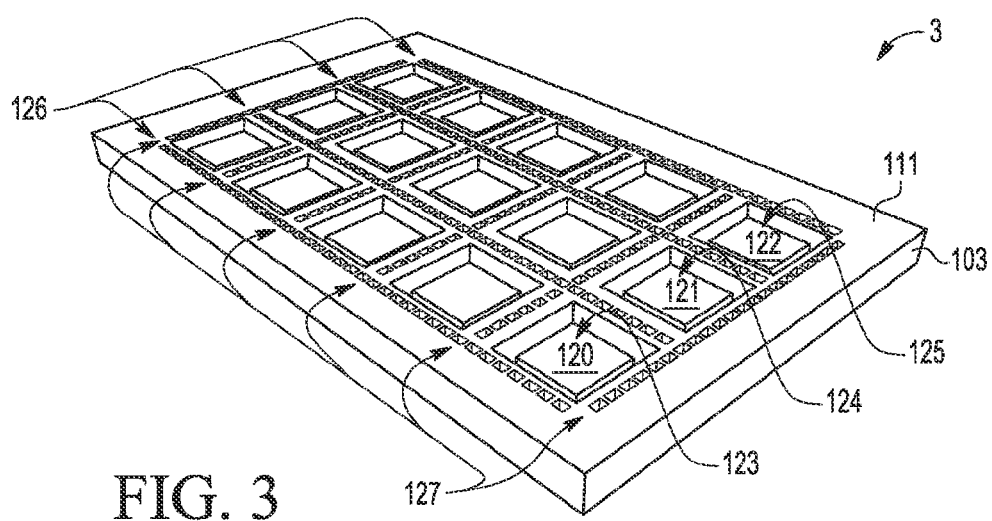
FIG. 3 illustrates a perspective view of the heat spreader array structure shown in FIG. 2 after a stamp or selective etch process is applied to define a heat spreader array with recessed pedestal areas and peripheral lid links.

FIG. 3 illustrates a perspective view of the heat spreader array structure 3 after additional processing is applied to the heat spreader array structure shown in FIG. 2 to recess the array of pedestals (e.g., 120-122) and to selectively recess the saw singulation recesses (e.g., 126, 127), thereby forming peripheral lid links between the array of recessed pedestals (e.g., 120-122). As shown, the heat spreader array structure 3 may be produced by machining, stamping, or etching a portion of the lid layer 103 to define an arrayed pattern of recessed die contact flags or pedestals 120-122 and saw singulation recesses 126-127. For example, a second etch process may be selectively applied to a patterned etch mask layer of photoresist formed on the upper surface of the lid layer 103, where the second etch process is controlled to partially etch or recess the pedestal structures (e.g., 120-122) with a pedestal etch process (e.g., 123-125) that does not further etch the pedestal recess openings. The second etch process may also be applied to recess selected saw singulation recess openings (e.g., 126, 127) completely through the lid layer 103, thereby reducing the amount of thermally conductive material that must subsequently be cut or sawed. In other embodiments where the singulation recess openings are formed with a criss-crossing pattern of single, partially etched recess openings, the second etch process may be applied to recess selected saw singulation recess openings in each single, partially etched recess opening, thereby forming a plurality of dam bars or peripheral lid links (not shown).

Figure 4:
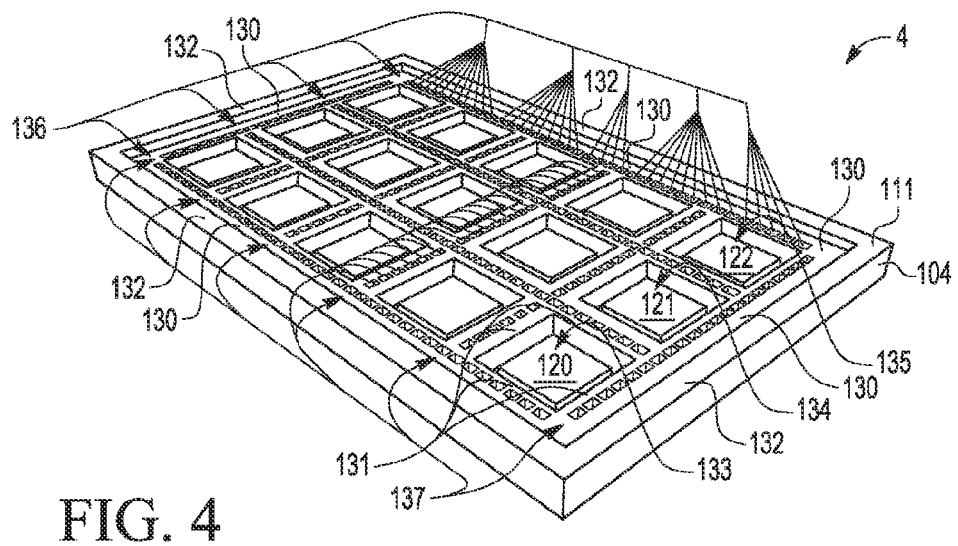
FIG. 4 illustrates a perspective view of the heat spreader array structure shown in FIG. 3 after a stamp or selective etch process is applied to define a heat spreader array with recessed lid feet structures around each pedestal recess and perimeter reservoir recesses at the periphery of the array of lid heat spreaders.

FIG. 4 illustrates a perspective view of the heat spreader array structure 4 after additional processing is applied to the heat spreader array structure shown in FIG. 3 to define recessed lid feet structures (e.g., 131) around each recessed pedestal (e.g., 120) and to define perimeter reservoir recesses 130 at the periphery of the heat spreader lid array. As shown, the heat spreader array structure 4 may be produced by machining, stamping, or etching a portion of the lid layer 104 to define a recessed surface 130 with respect to the upper surface 111, thereby defining an outer seal structure 132 at the periphery of the heat spreader array structure 4. In the recessed surface 130, an arrayed pattern of recessed saw singulation recesses (e.g., 136-137) and pedestal recess openings (e.g., 133-135) are defined. For example, a third etch process may be selectively applied to a patterned etch mask layer of photoresist formed on the upper surface of the lid layer 104, where the third etch process is controlled to partially etch or recess the upper surface 111 of the lid layer 104 to define recessed lid feet structures (e.g., 131) and perimeter reservoir recesses 130 without further etching the recessed pedestal structures (e.g., 120-122) or the bottoms of the pedestal recess openings (e.g., 133-135). This same etch process may recess the upper surface of the previously-formed saw singulation recesses, thereby forming the arrayed pattern of recessed saw singulation recesses (e.g., 136-137).

Figure 5:
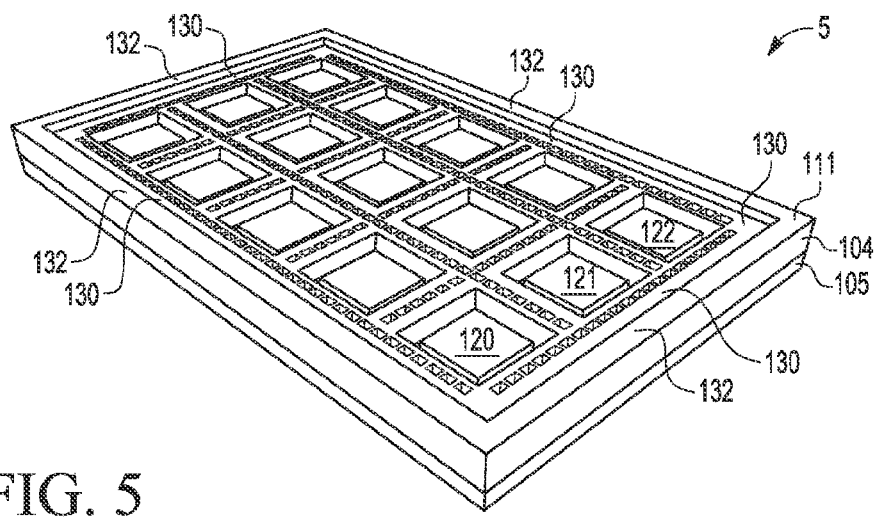
FIG. 5 illustrates a perspective view of the heat spreader array structure shown in FIG. 4 after the heat spreader array structure is attached to a layer of molding tape for placement on a heated bottom plate of a compression mold system.

FIG. 5 illustrates a perspective view of the heat spreader array structure 5 after the heat spreader array structure shown in FIG. 4 is attached to an underlying structure 105 which may be implemented as single sided molding tape. In cases where the heat spreader array structure 5 includes any recessed openings that extend completely through the lid layer 104, the molding tape 105 may be used to prevent mold compound from bleeding across the lid surface and provides improved structural integrity to the lid array for improved handling.

Figure 6:
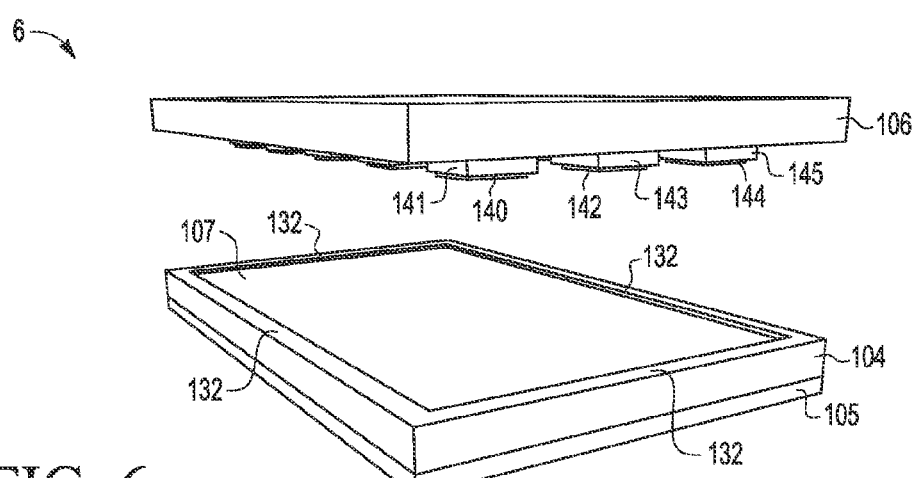
FIG. 6 illustrates a perspective view of the heat spreader array structure shown in FIG. 5 after recesses in the heat spreader array structure are partially filled with mold compound and a substrate panel array of integrated circuit die are positioned in registry with the heat spreader array structure for compression molding.

FIG. 6 illustrates a perspective view of the heat spreader array structure 6 after recess openings within the outer edges of perimeter reservoir recess 130 formed in the heat spreader array structure 6 are filled with mold compound 107. As described herein, the mold compound 107 may be formed by filling recess openings in the heat spreader lid with mold compound, such as by filling and then melting a granular mold compound, applying and then melting a sheet of B-staged mold compound, or dispensing liquid mold compound into the recess openings. As illustrated, the outer seal structure 132 contains the mold compound 107 within the heat spreader lid array structure 6 to be within the edges of perimeter reservoir recess 130, thereby eliminating the need for a lower mold cavity tool.

FIG. 6 also shows a substrate panel 106 with a plurality of integrated circuit die 141, 143, 145 arranged in a matrix array, where the substrate panel 106 is positioned in registry with the heat spreader array structure 6 for compression molding. Though not explicitly shown, it will be appreciated that each of the integrated circuit die 141, 143, 145 is attached to the substrate panel 106 with a die attach layer formed between the die and the substrate panel. In addition, each die is electrically connected to conductors in the substrate panel 106 using any desired substrate-to-die conductor mechanism, such as wire bonding, flip chip solder bumps, solder-tipped copper pillars, and other means known by those skilled in the art. Thus, the integrated circuit die on the substrate panel 106 may be formed as an array of ball grid array (BGA) devices, fine pitch BGAs (JEDEC), molded array package (MAP) BGAs, plastic BGAs (PBGA), thermally enhanced plastic BGAs (TEP-BGA), large body size BGAs, or the like. In selected embodiments, an array of solder balls may be attached to contact pads on the exposed or top surface of panel 106 that opposes the surface to which integrated circuit die 141, 143, 145 are attached. Alternatively, an array of land grid array devices may be formed if solder balls are not attached to contact pads on the exposed surface of panel 106.

Each integrated circuit die 141, 143, 145 on the substrate panel 106 also includes a thermal interface material (TIM) layer 140, 142, 144 formed on a lower surface of the integrated circuit die. Alternatively, the recessed pedestal structures may be pre-coated with a TIM layer. In selected embodiments, the TIM layers (e.g., 140, 142, 144) may be formed with a compliant, highly thermally conductive grease, non-curing silicone system, or a curable low modulus of elasticity silicone system to minimize the thermal resistance between the die and the heat sink pedestal, to protect the die from damage from the pedestal, and to assist in displacing the mold compound from between the die and pedestal surfaces. The TIM layer (e.g., 140, 142, 144) is positioned on each die (e.g., 141, 143, 145) to provide direct thermal contact between the die and the underlying recessed pedestal structure (e.g., 120-122) once the substrate panel 106 is compressed into contact with the heat spreader array structure 6. However, in FIG. 6, the underlying recessed pedestal structures (e.g., 120-122) are not visible because they are covered by the mold compound 107.

The process of partially filling at least the recess openings in heat spreader array structure 6 is controlled so that the volume of the recess openings that is not filled with mold compound 107 corresponds to the displacement volume of the integrated circuit die (e.g., 120-122) and any additional substrate panel structures (e.g., wire bond conductors, die attach adhesive, TIM) inserted into the recess openings formed in the heat spreader array structure 6. In particular, the perimeter reservoir recesses 130 in the heat spreader lid array are sized to provide an "overflow" region for the mold compound 107 that is displaced when the integrated circuit die (any additional substrate panel structures) are slowly immersed into the mold compound 107 as the substrate panel 106 is closed or compressed against the heat spreader array structure 6. With this arrangement, the heat spreader array structure 6 effectively acts as a lower mold platen where the outer seal structure 132 at the periphery of the heat spreader array structure 6 contacts the periphery of the substrate panel 106, thereby containing the mold compound 107 within to seal the substrate panel 106 to the heat spreader array structure 6.

To ensure that the integrated circuit die (e.g., 141, 143, 145) make direct mechanical and thermal contact to the recessed die flags or pedestals (e.g., 120-122) via the TIM layers (e.g., 140, 142, 144), the vertical etch dimensions of the recesses formed in the heat spreader array structure 6 are controlled so that the vertical distance from upper surface of the outer seal structure 132 to the upper surface of the recessed die contact flags or pedestals (e.g., 120-122) is at least substantially equal to, or slightly less than, the combined thickness of the integrated circuit die (e.g., 141) and associated TIM layer (e.g., 140). In this way, the exertion of downward mold clamp force to compress the substrate panel 106 against the heat spreader array structure 6 causes the integrated circuit die (e.g., 141, 143, 145) to make direct thermal contact with the recessed die contact flags or pedestals (e.g., 120-122) without exerting excessive compression forces that could damage or crack the integrated circuit die (e.g., 141, 143, 145), and without exerting insufficient compression forces that would allow mold compound to remain between the die surface and the top surface of the recessed die contact flags or pedestals.

Figure 7:
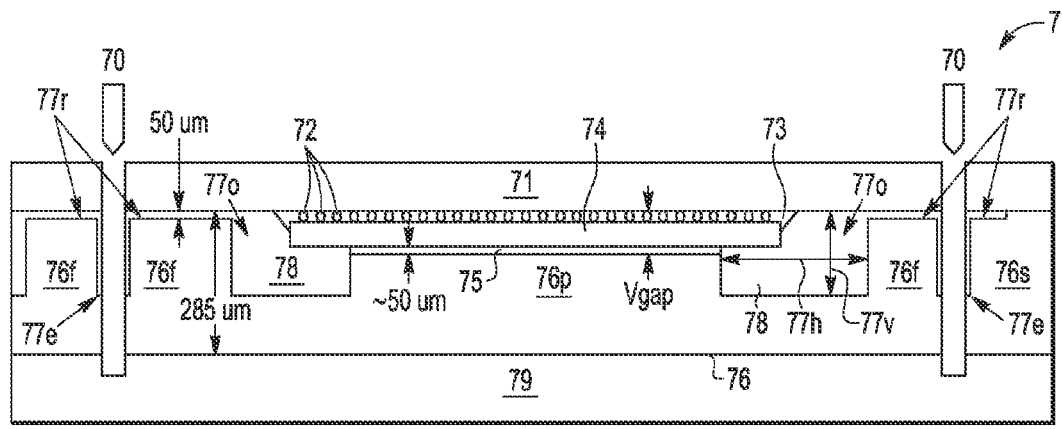
FIG. 7 is a cross-sectional view of a singulated flip chip integrated circuit package with an integrated lid heat spreader having expanded pedestal recess areas in accordance with selected embodiments of the present invention.

To illustrate an example of how the heat spreader array structure may be used in a compression molding process to encapsulate a plurality of integrated circuit die arranged on a carrier substrate in a matrix array, reference is now made to FIG. 7 which depicts a cross-sectional view of a singulated flip chip integrated circuit package 7 from a plurality of mold array packages attached to a molding tape layer 79 which may be formed as a layer of polymer film coated with an adhesive material. The depicted mold array package includes a substrate array portion 71 and lid array portion 76 that are compressed together to encapsulate the integrated circuit 74 with a mold compound 78 and exposed lid heat spreader structure 76.

The substrate array portion corresponds in general to the substrate panel 106 and arrayed integrated circuit die (e.g., 141, 143, 145) shown in FIG. 6, and includes a base carrier or die flag structure 71 having a first surface on which is affixed an integrated circuit (IC) die 74 along with other IC die arranged in a matrix array (not shown). The IC die 74 may be any type of integrated circuit device, such as a processor, digital signal processor (DSPs), or special function circuit, such as memory address generators, or circuits that perform any other type of function. Thus, the IC die 74 is not limited to a particular technology (such as CMOS) or derived from any particular wafer technology. Also, a variety of different die sizes can be accommodated with the heat spreader array structure described herein.

Each of the flip chip IC die 74 may be attached to the base carrier/die flag structure 71 (e.g., with a solder reflow process, a conductive adhesive joining process, or other suitable means such as a thermo-compression process) to create the electrical connections between the flip chip bumps 72 and contacts (not shown) on the substrate array portion 71. Underfill material 73 may be applied after the electrical connections between IC die 74 and substrate array portion 71 are formed via capillary underfill processes, or the underfill material 73 may be preapplied to the IC die 74 or substrate array portion 71 prior to the formation of the electrical connections between IC die 74 and substrate array portion 71. Underfill material may be curable liquid epoxy system, a cyanate ester system, or other material well known to those of skill in the art. Typically, underfill materials must undergo a curing operation after flip chip assembly. Though not depicted, the flip-chip bump conductors 72 may be formed in rows and columns for making electrical contact between the base carrier/die flag structure 71 and IC die 74.

The lid array portion corresponds in general to the heat spreader array structure 6 shown in FIG. 6, and includes an integrated lid heat spreader 76 which is formed with thermally conductive material such as, for example, copper, aluminum or alloys thereof. The lid heat spreader structure is formed with a recessed pedestal structure 76p that is surrounded and defined by expanded pedestal recess openings 77o formed by partially etching the thermally conductive lid layer 76. As formed, the pedestal recess openings 77o each have a vertical etch dimension 77v and a horizontal etch dimension 77h that extends past the side edge of the integrated circuit die 74. The horizontal etch dimension 77h defines the size of the recessed die contact flags or pedestals 76p for making thermal contact with the integrated circuit 74, and also defines the size of the recessed lid feet structures 76f which may also be used to provide a thermal conduction path to the base carrier 71. In addition, the pedestal recess openings 77o are formed to contain the fluid mold compound material.

After partially filling the recess openings 77o in the lid array portion with a fluid mold compound material (e.g., melted or liquid mold compound), the substrate array portion is slowly compressed against the lid array portion. As the integrated circuit die 74 displaces mold compound during this compressive motion, the molding compound material 78 fills the pedestal recess openings 77o to thereby seal the IC die 74 and substrate 71 to the integrated lid heat spreader 76. In this way, the IC die 74 is encased in mold compound 78 which is typically in the form of an epoxy compound or any other appropriate encapsulating material.

To ensure that the integrated circuit die 74 makes direct thermal contact to the recessed die contact flag/pedestal 76p via the TIM layer 75, the vertical etch dimension 77v of the expanded pedestal recess openings 77o is controlled so that the vertical gap distance Vgap from the surface of the substrate 71 to the surface of the recessed die contact flag/pedestal 76p is at least substantially equal to, or slightly less than, the combined thickness of the integrated circuit die 74 and associated TIM layer 75. In this way, the compression of the substrate array portion against the lid array portion will causes the TIM layer 75 to be squeezed between the substrate 71 and recessed pedestal 76p, thereby expanding outward so that the integrated circuit die 74 makes direct thermal contact with the recessed die contact flag/pedestal 76p without exerting excessive compression forces that could damage or crack the integrated circuit die 74, and without exerting insufficient compression forces that would allow mold compound to remain between the die surface and the top surface of the recessed die contact flag/pedestal 76p.

To assist with the compression mold process, the integrated lid heat spreader 76 includes lid feet structures that are peripherally disposed to surround and define the pedestal recess openings 77o, thereby forming an extension of the integrated lid heat spreader 76. In selected embodiments illustrated in FIG. 7, the integrated lid heat spreader 76 includes recessed lid feet structures 76f that do not extend to contact the substrate 71 during compression molding, leaving a small gap (e.g., 50 um) defining a reservoir opening 77r through which mold compound material 78 can flow from the recess openings 77o to facilitate the compression mold process. The outer edges of the perimeter reservoir recess formed in the lid array may be designed to define a volume that is not completely filled by the liquid mold compound displaced during the compression of the substrate array into the lid array, thus providing a reservoir into which the mold compound may flow while filling the gap between lid feet structures 76f and the surface of substrate 71. In other embodiments, at least a part of the lid feet structures extend to make contact with the substrate 71 (not shown) during compression molding to help seal the mold compound material 78 in the recess openings 77o and facilitate the compression mold process by providing a structural barrier to prevent IC damage from overcompression. A specific thickness of mold compound between lid feet structures 76f and substrate 71 is not needed since the mold compound 78 in the regions surrounding the pedestal 76f and the die 74 also bond the lid to the substrate, but the thickness of reservoir opening 77r may be designed to be within a predetermined range (e.g., approximately 0.025-1 mm, and more typically 0.050 mm). However, the thickness of the TIM 75 should be controlled so that there is substantially no mold compound material 78 between the die surface and the surface of the pedestal 76p. In the example shown in FIG. 7 where the flip chip integrated circuit package 7 is located at an edge of the molded array package, the recessed lid foot structure 76f on the right is adjacent to an outer seal structure 76s in the integrated lid heat spreader 76, thereby defining a first reservoir opening 77r for flow of excess mold compound 78. On the other or left side of the flip chip integrated circuit package 7, the recessed lid foot structure 76f is adjacent to another flip chip IC package (not shown), thereby defining another shared reservoir opening 77r for flow of excess mold compound 78. Even with the recessed lid feet structures 76f being separated from the substrate 71 by a small gap that will be filled with mold compound 78, the feet structures 76f provide an additional thermal transfer path for dissipating heat from the integrated circuit 74. In addition, the outer seal structures 76s formed on the periphery of the integrated lid heat spreader array 76 provide a lid-to-substrate seal ring for the mold compound 78. In addition to sealing the mold compound 78, the height of the seal ring surface plane at the top of the outer seal structures 76s (in relation to the bottom of the recess openings 77o) can be designed to prevent the recessed pedestal 76p from crushing the IC die 74 during molding since it can seat against the substrate 71 before the pedestal 76p can contact the die 74.

Subsequent to compression molding and initial curing of the mold compound 78, and possible post-mold curing, individual packaged devices are singulated with a saw or laser or other cutting device 70 that is applied to the mold array packages along the saw cut lines defined by the saw singulation recesses. As illustrated, the cutting device 70 is positioned to form saw cut lines for separating individual packaged die by cutting down through the mold compound 78 and the integrated lid heat spreader 76 along the recessed singulation areas 77e which are formed in the integrated lid heat spreader 76 to remove thermally conductive integrated lid heat spreader material from the saw singulation path, thereby increasing throughput, reducing smearing of the integrated heat spreader material, and extending saw blade life. Depending on the width of the cut lines formed by the saw cutting device 70, the individual packages may leave a portion of the integrated lid heat spreader 76 at the bottom peripheral side end with mold compound 78 at the top peripheral side end (as viewed in FIG. 7). In selected embodiments, the width of the recessed singulation areas 77e are designed to be wider than the width of the saw cut lines to assure that the sawing mechanism 70 does not have to cut through the majority of the thickness of the lid array 76, so by design there should always be a portion of the integrated heat spreader 76 at the bottom peripheral side end.

After singulation and removal of the integrated circuit package from the supporting tape layer 79, the integrated lid heat spreader 76 will provide an external heat dissipation surface for the package 7 to efficiently and directly convey heat from the packaged integrated circuit 74 through the TIM layer 75 and recessed pedestal structure 76p to the external surface of integrated lid heat spreader 76. Heat may removed from this surface via a variety of means, including convection, forced air cooling, attachment of a heat sink to the external surface of integrated lid heat spreader 76, and other mean known by those with skill in the art. Heat may also be spread from integrated circuit 74 into the TIM 75, recessed pedestal structure 76p, and then into the (recessed) lid feet structures 76f, through the mold compound filling the reservoir openings 77r, into substrate 71, and into the printed circuit board to which integrated circuit package 7 is bonded. In addition, external conductors, such as solder ball conductors (not shown), are attached to the exposed surface of the substrate 71 for making electrical connection to the printed circuit board and to the integrated circuit 74 through electrically conductive paths, such as wires, contact pads or layers, conductive vias, conductive traces (not shown) formed in a carrier substrate 71 and the flip-chip bump conductors 72.

Selected embodiments of the integrated lid heat spreader structure disclosed herein may also be used with wire bond packaging which can be less expensive than flip-chip packaging. For an example illustration of a wire bond packaging embodiment, reference is now made to FIG. 8 which depicts a cross-sectional view of a singulated ball grid array integrated circuit package 8 formed in a mold array package that is attached to an molding tape layer 89. The depicted mold array package includes a substrate array portion 81-85 and lid heat spreader array structure 86 that are compressed together to encapsulate the integrated circuit 84 with a mold compound 88 and exposed lid heat spreader array structure 86. The substrate array portion includes an integrated circuit (IC) die 84 attached to a surface of a base carrier substrate 81 using a die attach layer 82, such as an adhesive layer, a die attach epoxy or other die attach techniques known in the art. The IC die 84 is electrically connected to the substrate 81 via one or more wire bond conductor(s) 83 connected between contacts typically at the peripheral edges of the active surface of the die 84 and surface contacts on the substrate 81.

The lid array portion 86 is formed with thermally conductive material by selectively etching, machining, stamping expanded pedestal recess openings 87o therein to define and surround a recessed pedestal structure 86p and to contain the fluid mold compound material 88 so that a separate lower mold cavity tool is not required. The expanded pedestal recess openings 87o have a vertical etch dimension 87v and a horizontal etch dimension 87h that extends past the side edge of the integrated circuit die 84. The horizontal etch dimension 87h defines the size of the recessed die contact flags or pedestals 86p for making thermal contact with the integrated circuit 84, and also defines the size of the recessed lid feet structures 86f which may also be used to provide a thermal conduction path to the substrate 81. The vertical etch dimension 87v provides an extension opening in the lid array portion 86 in which the wire bond conductor(s) 83 may extend. This extension opening in the lid array portion is used in combination with the compression molding process described herein to largely eliminate any wire sweep problems that can be caused by stress exerted on the wire bond conductors 83 during the transfer molding process typically used in microelectronic packaging. In addition to providing space for the wire bond conductors 83, the pedestal recess openings 87o define lid feet structures 86f that are peripherally disposed to form an extension of the integrated lid heat spreader 86. The lid feet structures 86f may extend to contact the substrate 81 during compression, or may extend to leave a small gap (e.g., 50 um) defining a reservoir opening 87r through which mold compound material 88 can flow from the recess openings 87o during the compression mold process. In the example shown in FIG. 8 where the wire bonded integrated circuit package 8 is located at an edge of the integrated array package, the recessed lid foot structure 86f on the right is adjacent to an outer seal structure 86s in the integrated lid heat spreader 86, thereby defining a first reservoir opening 87r for flow of excess mold compound 88. As will be appreciated, the outer seal structures 86s formed on periphery of the integrated lid heat spreader array 86 provide a lid-to-substrate seal ring for the mold compound 88. On the other or left side of the wire bonded integrated circuit package 8, the recessed lid foot structure 86f is adjacent to another wire bonded IC package (not shown), thereby defining another shared reservoir opening 87r for flow of excess mold compound 88. Even when the recessed lid feet structures 86f are separated from the substrate 81 by a small gap, they provide an additional thermal transfer path to the substrate 81 for dissipating heat from the integrated circuit 84.

To ensure that the integrated circuit die 84 makes direct thermal to the recessed die contact flag/pedestal 86p via the TIM layer 85, the vertical gap distance Vgap from surface of the substrate 81 to the surface of the recessed die contact flag/pedestal 86p is controlled to be at least substantially equal to, or slightly less than, the combined thickness of the integrated circuit die 84, die attach adhesive 82, and associated TIM layer 85 so that the mold compression process will squeeze and expand the TIM layer 85 between the substrate 81 and recessed pedestal 86p to make direct thermal contact therebetween without exerting excessive compression forces that could damage or crack the integrated circuit die 84, and without exerting insufficient compression forces that would allow mold compound to remain between the die surface and the top surface of the recessed die contact flag/pedestal 86p.

Subsequent to compression molding and initial curing of the mold compound 88, and possible post-mold curing, external conductors, such as solder ball conductors (not shown), may be attached to the substrate 81 for making electrical connection to the integrated circuit 84 through electrically conductive paths formed in a carrier substrate 81 and the wire bond conductors 83. In addition, individual packaged devices are singulated with a saw or laser or other cutting device 80 by cutting the integrated lid heat spreader 86 along the recessed singulation areas 87e formed in the integrated lid heat spreader 86, thereby increasing throughput and extending saw blade life. In addition, the supporting tape layer 89 is then removed. The resulting integrated lid heat spreader 86 on the singulated ball grid array integrated circuit package 8 provides an external heat dissipation surface to efficiently and directly convey heat from the packaged integrated circuit 84 through the TIM layer 85 and recessed pedestal structure 86*p* and the (recessed) lid feet structures 86*f*.

While the expanded pedestal recess openings described hereinabove provide space for wire bond conductors from the IC die surface, this additional space effectively reduces the thermal transfer capability of the integrated lid heat spreader structure since the recessed pedestal structure is smaller than the IC die surface. Accordingly, there may be packaging applications where there is a need for an integrated lid heat spreader structure that provides improved or optimized heat spreading by having recessed pedestal structure with a larger heat transfer surface area. For an example illustration of an integrated lid heat spreader structure which is optimized for heat spreading, reference is now made to FIG. 9 which depicts a cross-sectional view of a singulated flip chip integrated circuit package 9 formed in a mold array package that is attached to an adhesive layer 99. The depicted mold array package includes a substrate array portion 91-95 and lid array portion 96 that are compressed together. The substrate array portion includes an integrated circuit (IC) die 94 that is attached to a surface of a base carrier substrate 91 using an underfill encapsulant layer 93, and that is electrically connected to the substrate 91 via flip chip bumps 92 connected between the active surface of the die 94 and surface contacts on the substrate 91 (not shown).

The lid array portion 96 is formed with thermally conductive material by selectively etching, machining, stamping pedestal recess openings 97*o* therein to contain the fluid mold compound material 88 so that a separate lower mold cavity tool is not required. The pedestal recess openings 97*o* surround a recessed pedestal structure 96*p* that is larger than the IC die 94, and are defined with a vertical etch dimension 97*v* and a horizontal etch dimension 97*h* that does not extend to the side edge of the integrated circuit die 94. In addition to defining a pedestal structure 96*p* with a larger heat transfer surface area for making thermal contact with the integrated circuit 94, the horizontal etch dimension 97*h* also defines the size of the recessed lid feet structures 96*f* which provide an additional thermal conduction path to the substrate 91. As depicted, the lid feet structures 96*f* are peripherally disposed to form an extension of the integrated lid heat spreader 96 which may extend to contact the substrate 91 during compression, or may extend to leave a small gap (e.g., 50 um) defining a reservoir opening 97*r* through which mold compound material 98 can flow from the recess openings 97*o* during the compression mold process. In the example shown in FIG. 9 where the integrated circuit package 9 is located at an edge of the molded package array, the recessed lid foot structure 96*f* on the right is adjacent to an outer seal structure 96*s* in the integrated lid heat spreader 96, thereby defining a first reservoir opening 97*r* for flow of excess mold compound 98. Again, the outer seal structures 96*s* formed on periphery of the integrated lid heat spreader array 96 provide a lid-to-substrate seal ring for the mold compound 98. On the other or left side of the BGA integrated circuit package 9, the recessed lid foot structure 96*f* is adjacent to another BGA IC package (not shown), thereby defining another shared reservoir opening 97*r* for flow of excess mold compound 98. Even when the recessed lid feet structures 96*f* are separated from the substrate 91 by a small gap, they provide an additional thermal transfer path to the substrate 91 for dissipating heat from the integrated circuit 94.

To ensure that the integrated circuit die 94 makes direct thermal to the recessed die contact flag/pedestal 96*p* via the TIM layer 95, the vertical gap distance Vgap from surface of the substrate 91 to the surface of the recessed die contact flag/pedestal 96*p* is controlled to be at least substantially equal to, or slightly less than, the combined thickness of the integrated circuit die 94, the thickness occupied by underfill encapsulant 93 and flip chip bumps 92, and associated TIM layer 95. In this way, the mold compression process will squeeze and expand the TIM layer 95 between the substrate 91 and recessed pedestal 96*p* to make direct thermal contact therebetween without exerting excessive compression forces that could damage or crack the integrated circuit die 94, and without exerting insufficient compression forces that would allow mold compound to remain between the die surface and the top surface of the recessed die contact flag/pedestal 96*p*.

Subsequent to compression molding and initial curing of the mold compound 98, and possible post-mold curing, external conductors, such as solder ball conductors (not shown), may be attached to the substrate 91 for making electrical connection to the integrated circuit 94 through electrically conductive paths formed in a carrier substrate 91 and the flip chip bumps 92. In addition, individual packaged devices are singulated with a saw or laser or other cutting device 90 by cutting the integrated lid heat spreader 96 along the recessed singulation areas 97*e* formed therein, thereby increasing throughput and extending saw blade life. In addition, the supporting tape layer 99 is removed. The resulting integrated lid heat spreader 96 on the singulated flip chip integrated circuit package 9 provides an external heat dissipation surface to efficiently and directly convey heat from the packaged integrated circuit 94 through the TIM layer 95 and recessed pedestal structure 96*p* and the (recessed) lid feet structures 96*f*.

Figure 8:
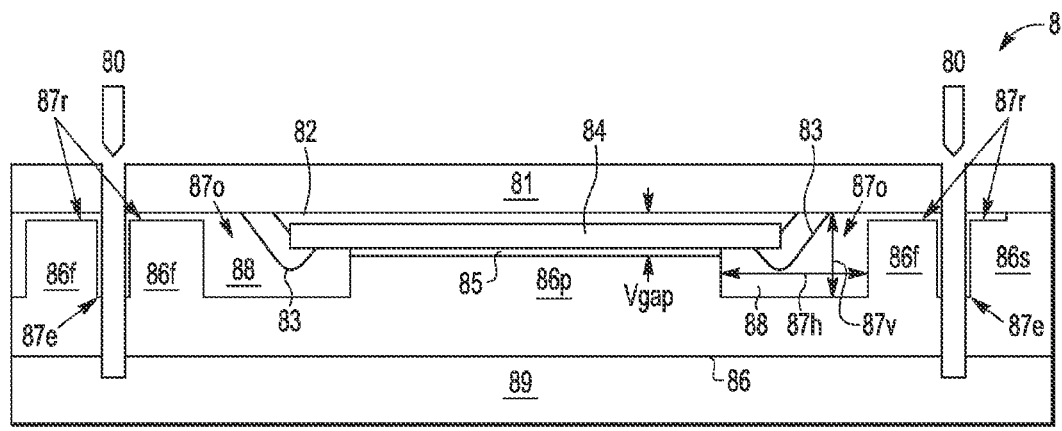
FIG. 8 is a cross-sectional view of a singulated ball grid array integrated circuit package with an integrated lid heat spreader having expanded pedestal recess areas in accordance with selected embodiments of the present invention.
Figure 9:
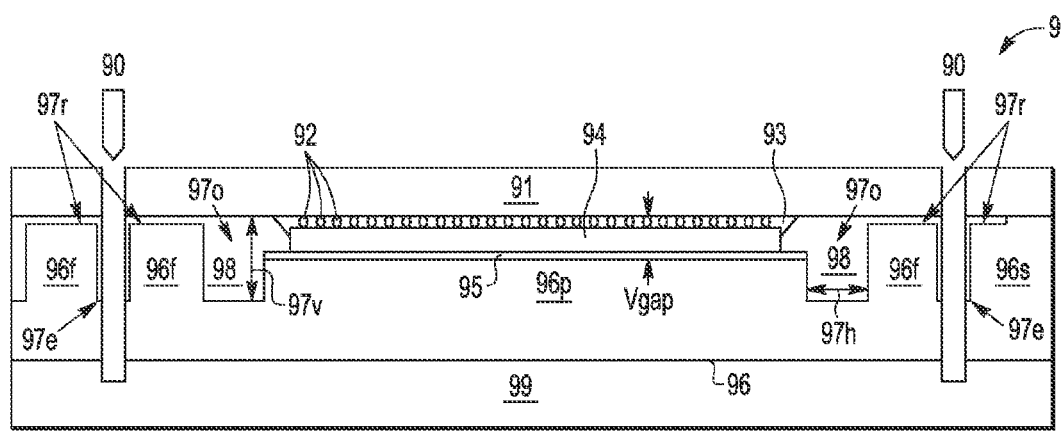
FIG. 9 is a cross-sectional view of a singulated flip chip integrated circuit package with an integrated lid heat spreader having a pedestal that is optimized for heat spreading in accordance with selected embodiments of the present invention.

As can be seen from FIGS. 7-9, the integrated lid heat spreader structure described herein is provided as an n×m (n, m>1) array or matrix of very low profile, low cost heat spreader lids which can be fabricated by means commonly used to make lead frames (etching, stamping, coining, or machining). The low profile array of heat spreader lids may be applied together for direct attachment to a corresponding array of very low profile IC die (e.g., ≤100 um) that are encapsulated with use of low pressure compression molding. By forming pedestal recess openings in each heat spreader lid with an extended recess around each pedestal, wire bond conductors, such as ultra-low loop wire bonding (≤50 μm loop height on first row, and lowest possible bonding on all other rows), may be used to make electrical connection to the die with bare bond wire or lowest looping possible with insulated wire (e.g. X-wire). Low pressure compression molding and bonding of the lid heat spreader array to a single-sided molding tape prevents mold compound bleed across the lid surface and provides improved structural integrity to lid array for improved handling. In addition, a direct thermal path is provided from each IC die to a corresponding heat spreader lid to facilitate dissipation of the heat generated by the IC die, thereby reducing the likelihood of integrated circuit or package failure due to overheating. With the heat spreader lid being exposed to the ambient environment on the top and side surfaces, the integrated circuit packages are provided with a substantial surface area for the convection of heat away from the IC die. An additional thermal dissipation path is provided by one or more lid feet structures in each heat spreader lid. With improved thermal performance, the power dissipation capability of the integrated circuit packages can be approximately doubled when compared to a conventional molded fine pitch ball grid array package or molded array package. For example, a typical 14×14 mm fine pitch BGA may be able to dissipate approximately 1.5-2 Watts (W) with device A, while the device junction temperature is maintained at an acceptable temperature (typically between 80° C. and 125° C., depending upon the device and device manufacturing technology), and with this invention the package could dissipate approximately 3-4 W, or more, with another device, device B, while an acceptable device junction temperature is maintained. Alternatively, the junction temperature of the same semiconductor device A can be reduced, for example, by approximately 10-50%, depending upon the device size, and thermal management configuration and environment. The disclosed integrated lid heat spreader structures also enable high array density due to very small gap from lid edge to singulated package edge. This distance would be much larger with use of individual lids placed on MAP array. Thus, selected embodiments provide an inexpensive method for volume production of reliable and thermally enhanced integrated circuit packages that can be implemented using current semiconductor assembly equipment and compression molding. Hence, capital investment may be kept low. Indeed, there is no requirement of any lower mold cavity tool since the arrayed lid heat spreader structures become the mold cavity to be initially filled with mold compound. Package rigidity and reliability are enhanced with the provision of the integrated heat spreader structure which is simply shaped, and easy to incorporate into the manufacture and assembly process. Additionally, the integrated heat spreader design is suitable for use in all package types and sizes.

Figure 10:
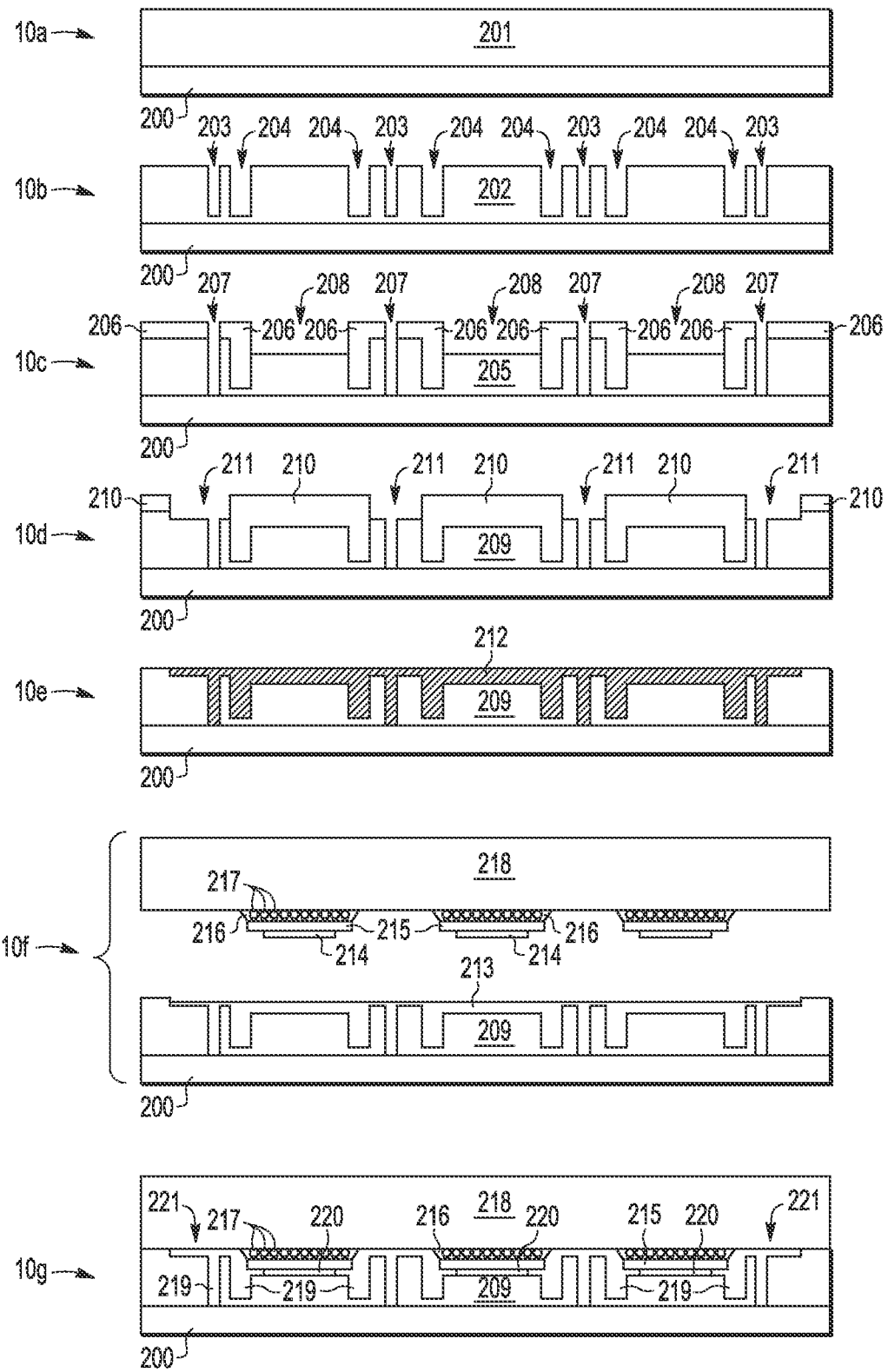
FIG. 10 is a diagrammatic cross-sectional depiction of various manufacturing process steps which may be used to form a thermally enhanced flip chip integrated circuit lid heat spreader package in accordance with various embodiments of the present invention.

The manufacturing process of the thermally enhanced integrated circuit package may include further steps that are commonplace in the environment of manufacturing a semiconductor package. For example, FIG. 10 shows diagrammatic cross-sectional depiction of various manufacturing process steps which may be used to form a thermally enhanced flip chip integrated circuit lid heat spreader package. As depicted in FIG. 10a, a single lead frame heat spreader lid layer 201 of thermally conductive material (e.g., metal) is attached to a single-sided molding tape layer 200. As shown in FIG. 10b, initial singulation area recess openings 203 and pedestal recess openings 205 are formed or patterned in the lead frame heat spread lid layer 202 to a first or initial depth, such as by using a patterned mask and etch process to define an array of initial pedestal structures therebetween. If desired, additional recess openings may then be formed to further recess the singulation area recess openings 207 (or portions thereof) and pedestal structures 208, such as by forming a patterned etch mask 206 which protects the initial pedestal recess openings but otherwise allows the lead frame heat spread lid layer 205 to be etched or recessed, as shown in FIG. 10c. In addition or in the alternative, reservoir recess openings 211 are formed or patterned to a predetermined reservoir depth, such as by using a patterned mask 210 which protects at least the outer seal ring structures formed on the periphery of the lead frame heat spread lid array layer 209 (and may also protect the pedestal structures and pedestal recess openings), but otherwise allows the lead frame heat spread lid layer 209 to be etched or recessed, as shown in FIG. 10d. As shown in FIG. 10e, the recess openings in the lead frame heat spread lid array layer 209 may be filled with a mold compound in sheet form, or a liquid, granular, or powdered, mold compound 212. Subsequently (as shown in FIG. 10f), the lead frame heat spreader lid array layer 209 is placed in registry with an inverted substrate array 214-218 and heated, such as by using a heated bottom plate of a compression mold system. The heating process may cause densification of the mold compound 213 into a smaller volume as voids trapped in the granular or powdered mold compound are driven off during the melting of the mold compound. As will be appreciated, the substrate array may include a plurality of single semiconductor dies 215 that have been inspected and attached to a carrier substrate 218 via typical flip chip solder reflow processes to connects flip chip bumps 217 to substrate pads (not shown), or any other appropriate means, then underfilled with encapsulant material 216 so as to be arrayed in alignment with the array of pedestal structures. In addition, electrically insulative, highly thermally conductive material 214 may be selectively formed or applied on each die 215. Suitable materials may be systems that include compliant, thermally conductive grease or non-curing silicone materials, or compliant, thermally conductive curable silicones or other types of polymeric systems, to minimize the thermal resistance between the die and the heat sink pedestal, and to protect the die from damage from the pedestal. In particular and as shown in FIG. 10g, when the substrate panel is compressed into contact with the lead frame heat spread lid array layer 209, the compressed TIM layers 220 provide a direct thermal path between the arrayed IC die 215 and the corresponding array of pedestal structures. The insertion of the IC die 215 also displaces the mold compound 219 into reservoir regions 221. Subsequent processing steps include a post mold cure of the mold compound 219, BGA solder ball attachment, laser marking steps, package singulation into individual elements, removal of singulated packaged devices from the single-sided molding tape layer, cleaning, and inspection.

As seen from the foregoing, the dimensions of the reservoir recess openings 211 (below the top seal ring surface plane of the heat spread lid layer 209) are controlled to provide a volume to closely match the volume of melted mold compound displaced by the die (and substructure), the TIM, and wire bonds (if present) during the immersion into the mold compound. In addition, the heat spread lid layer 209 may also include recessed lid feet structures peripherally disposed around each recessed pedestal structures to leave a small gap or passageway defining a reservoir opening through which mold compound material can flow from the pedestal recess openings during the compression mold process.

As described hereinabove, the lead frame heat spread lid array may be fabricated singulation area recess openings that are etched completely through the thickness of the lid array, alternating with regions that etch only partially through the lid material. Such embodiments typically include a single-sided molding tape layer to cover such openings and prevent leakage of mold compound material. However, the need for a molding tape layer may be eliminated by forming lead frame heat spread lid array with singulation area recess openings that extend only partially through the lid layer, such as by forming a moat that surrounds each lid unit in the array and is etched only partially through the lid material. With the partial thickness moat, the saw will have to cut through more metal than in the previous structure since there are no alternating regions in the moat that remove the full metal thickness, potentially reducing saw blade life. However, partial thickness moats eliminate the need for molding tape since there are no openings completely through the lid array in the area where the mold compound will be applied. In addition, etching costs are reduced in partial moat embodiments where there is no etching on the opposing surface. Finally, the edges of the lid will not have a series of potentially sharp protrusions due to saw cutting through the edge serrations, providing a handling benefit for such partial thickness moat embodiments.

Figure 11:
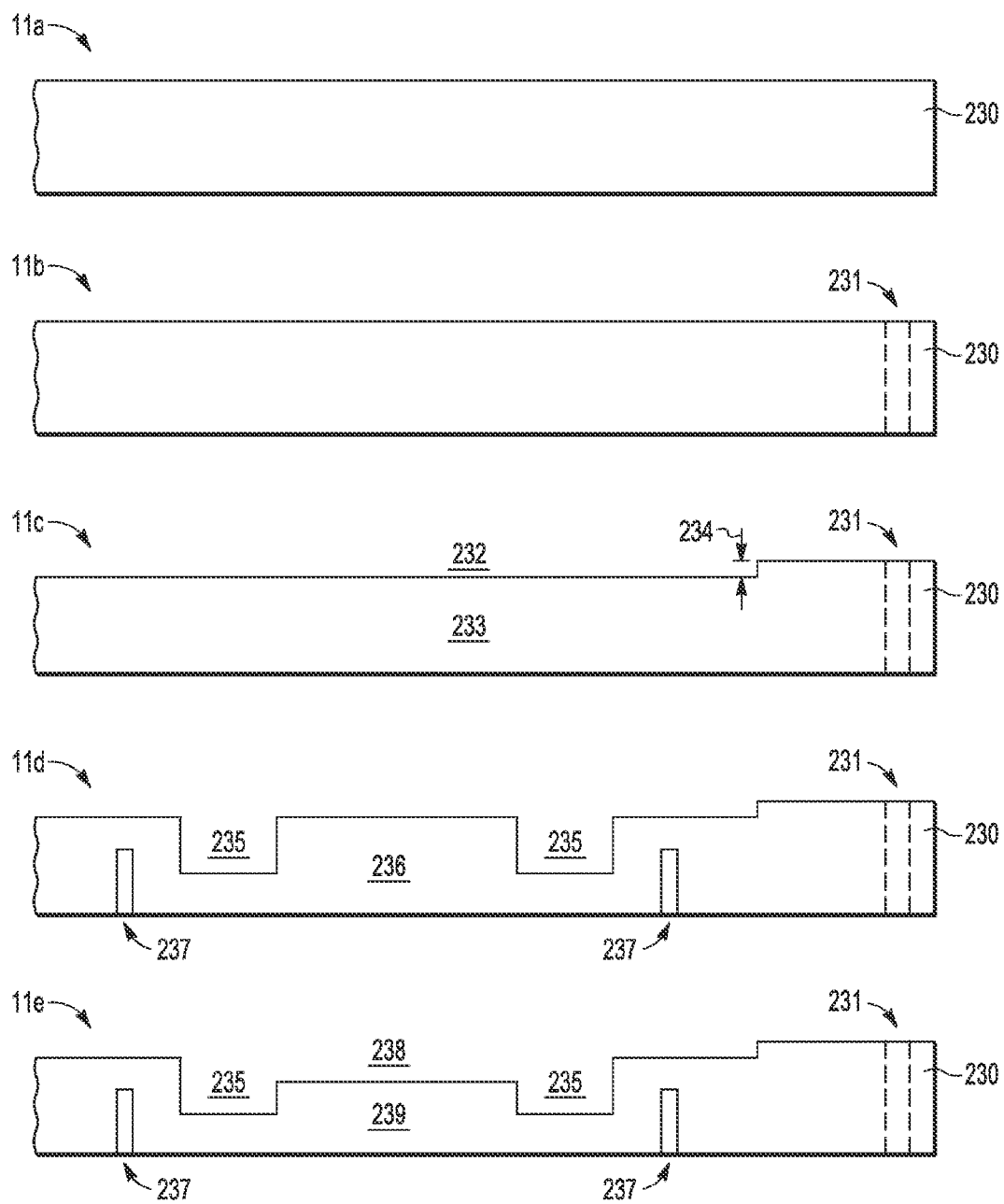
FIG. 11 is a diagrammatic cross-sectional depiction of various manufacturing process steps which may be used to form a heat spreader lid array in accordance with various embodiments of the present invention.

To illustrate selected embodiments for manufacturing a lead frame heat spread lid array with singulation area recess openings that extend only partially through the lid layer, reference is now made to FIG. 11 which depicts a diagrammatic cross-sectional depiction of various manufacturing process steps which may be used to form a heat spreader lid array in accordance with various embodiments of the present invention. As depicted in FIG. 11a, a single lead frame heat spreader lid layer 230 is provided that is formed with thermally conductive material (e.g., metal). As shown in FIG. 11b, a registration or alignment mark or tooling hole 231 is formed in the lid layer 230, such as by using a punch tool. As shown in FIG. 11c, a first recess opening 232 is formed or patterned in the lead frame heat spread lid layer 230 to a first or initial depth 234, such as by using a patterned mask and etch process to form the first recess opening 232. The recess opening 232 will subsequently define the lid seal reservoir for overflow mold compound material. As shown in FIG. 11d, initial pedestal recess openings 235 are formed or patterned in the lead frame heat spread lid layer 230 to a first or initial depth, such as by using a patterned mask and etch process to define an array of initial pedestal structures 236 therebetween. On the other side of the heat spread lid layer 230, singulation area recess openings 237 may be formed as continuous moats that extend only partially (e.g., 30-50%) through the lid layer 230, leaving a top portion of the lid layer 230 which will form a burr region after saw cutting that is bonded to the substrate with mold compound. Though not shown, the singulation area recess moat openings may instead be formed in the top surface of the lid layer 230, leaving a bottom portion of the lid layer 230 which will form a burr region on the top edge of the lid after saw cutting. As shown in FIG. 11e, an additional etch process 238 may be applied to recess the pedestal structures 239, such as by forming a patterned etch mask which exposes the pedestal structures but otherwise masks the lead frame heat spread lid layer 230 against etching. As shown in FIG. 11e, the recess openings 235, 238 in the lead frame heat spread lid array layer 230 may be used to contain a mold compound material for compression molding against an integrated circuit substrate array (not shown) such that displaced mold compound moves into the reservoir recess opening 232.

Figure 12:
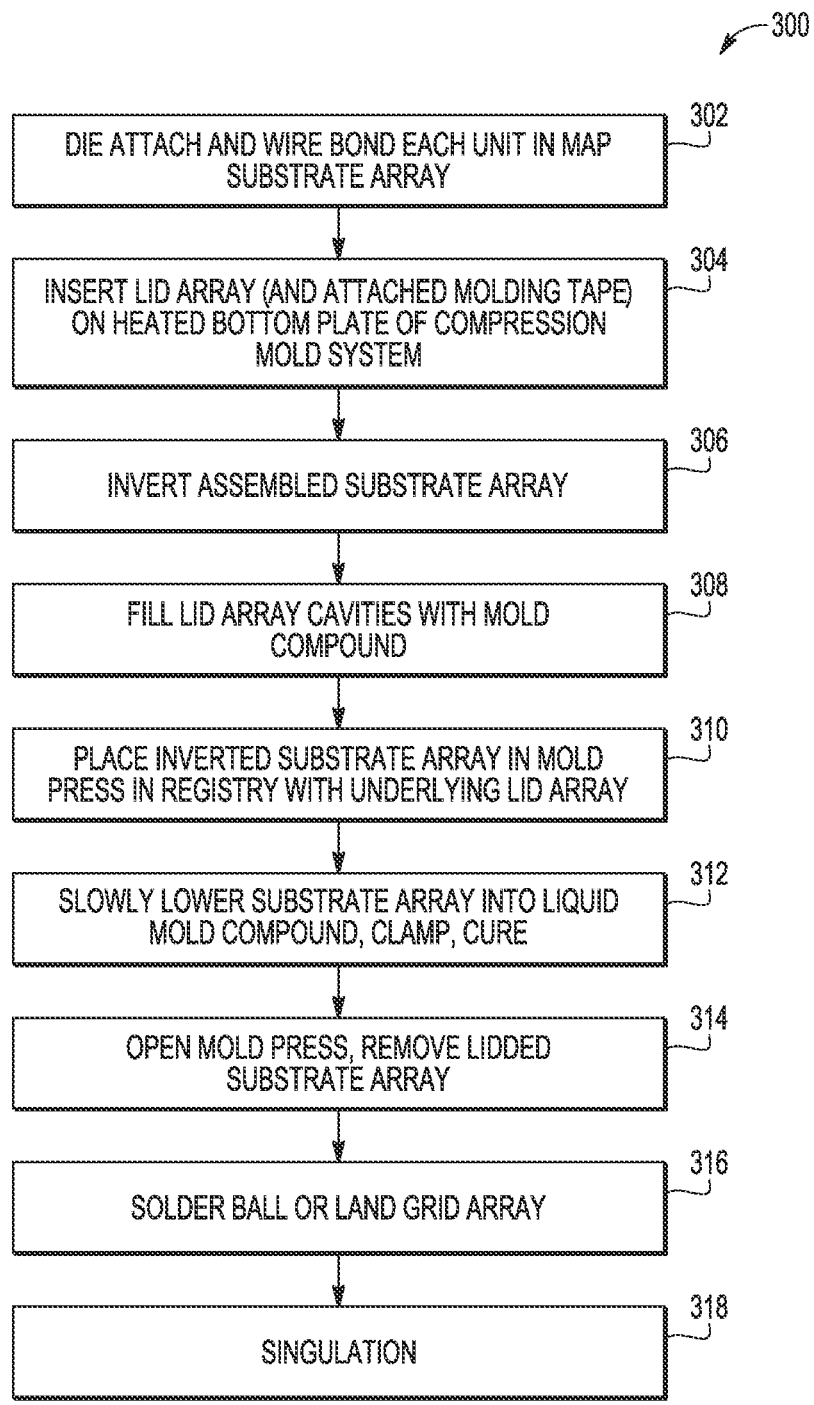
FIG. 12 illustrates an example flow chart depicting a process of fabricating thermally enhanced integrated circuit lid heat spreader packages using a heat spreader array in accordance with selected embodiments of the present invention.

Turning now to FIG. 12, there is illustrated an example flow chart sequence 300 depicting a process of fabricating thermally enhanced integrated circuit lid heat spreader packages using a heat spreader array in accordance with selected embodiments of the present invention. The process begins at step 302 when a substrate array is assembled by attaching a plurality of integrated circuit die in an array or matrix pattern to a molded array package (MAP) substrate, such as a ball grid array (BGA) substrate. At step 304, a heat spreader lid array having recessed openings or cavities formed in an upper surface (e.g., pedestal recess openings and reservoir openings) and attached molding tape are inserted on the heated bottom plate of a compression mold system. In embodiments where openings are formed through the entire thickness of the heat spreader lid in specified areas such as in the path of the singulation operation, the molding tape helps contain the mold compound. However, if the recesses are formed only partway through the heat spreader lid (e.g., only through ~30-70% of the original lid array material thickness), then the molding tape would not be required. When the head spreader array includes an outer or peripheral seal structure and otherwise has no openings through which mold compound material can leak, then no lower mold cavity tool is required in the compression mold system. The assembled substrate array is then inverted (step 316) and placed in the compression mold system along with the heat spreader lid array, and the recessed cavities in the lid array are then filled with a mold compound (step 308). The mold compound may be provided by melting mold compound material or dispensing a liquid mold compound in the lid array cavities. Once the mold compound is in liquid or fluid form, the inverted substrate array in the compression mold system is placed in registry with the underlying heat spreader lid array (step 310). With the lid array and substrate array aligned, the substrate array is slowly lowered into the liquid mold compound, clamped, and cured (step 312). In compressing the lid array and substrate array, the reservoir openings in the heat spreader lid array provide an overflow region for the mold compound that is displaced when the integrated circuit die are slowly immersed into the mold compound. The compression and curing of the mold compound provides a seal between the lid array and integrated circuit die on the substrate array, forming a lidded substrate array. Upon initial curing, the mold press can be opened to remove the lidded substrate array (step 314). The molded array may undergo a post mold curing operation after removal from the compression mold system. At this point, solder ball conductors may be attached to the substrate, though solder ball conductors are not required for land grid array (LGA) surface-mount packaging applications. Finally, the lidded substrate array may be singulated into individual integrated circuit packages (step 318), such as by using mechanical saws, lasers, or other appropriate means. At this point, the individual integrated circuit packages may be placed in a tray and sent for inspection, testing, and laser marking.

By now it should be appreciated that there is provided herein a method of making a plurality of integrated circuit packages. In the disclosed methodology, a substrate array is provided that includes a plurality of integrated circuit die having a first surface attached to a first surface of the substrate array and having a thermally conductive interface layer formed on a second surface of each integrated circuit die. In selected embodiments, the thermally conductive interface layer may be formed by applying a patterned layer of compliant, thermally conductive grease or non-curing silicon material to the second surface of each integrated circuit die. In addition, a heat spreader array having opposing first and second surfaces is provided, where molding tape may be fixed to the second surface of the heat spreader array. As formed, the heat spreader array includes recess openings formed in the first surface of the heat spreader array to define an outer seal ring and a plurality of pedestals aligned with the plurality of integrated circuit die, where each pedestal has a thermal contact surface that is at least as large as the second surface of the corresponding integrated circuit die. The heat spreader array may be provided by selectively etching, machining, or stamping a metal layer to define the plurality of recess openings, including a pedestal recess opening formed around each pedestal, one or more reservoir regions connected to the pedestal recess openings, and singulation recess openings formed around each pedestal recess opening. The heat spreader array may also be formed with recessed lid feet structures disposed peripherally around each of the plurality of pedestals to separate a pedestal recess opening formed around each pedestal and singulation recess openings formed around each pedestal recess opening. In addition, the heat spreader array may include a pedestal recess opening formed around each pedestal, where each pedestal recess opening provides sufficient space for any wire bond conductors attached to the integrated circuit die when the substrate array is clamped to the heat spreader array. The recess openings of the heat spreader array are partially filled with a melted or liquid mold compound, such as by dispensing liquid mold compound into the recess openings, or by filling the recess openings with a mold compound material in sheet, granular or powder form and then heating the mold compound material into melted mold compound that does not completely fill the recess openings. The substrate array may is then clamped to the heat spreader array by compressing the substrate array into contact with the outer seal ring of the heat spreader array so that the thermally conductive interface layer on each integrated circuit die makes direct contact with a corresponding pedestal from the heat spreader array. In this configuration, the melted or liquid mold compound is partially displaced into the recess openings, and the plurality of integrated circuit die is sealed to the heat spreader array by curing the mold compound in the plurality of recess openings, resulting in an array of molded packages, each having a portion of the substrate array exposed on a first side and a portion of the heat spreader array exposed on a second side. Subsequently, ball grid arrays may be formed on the exposed surface of the substrate array to be electrically connected to conductive traces formed in the substrate array, and/or the array of molded packages may be singulated into a plurality of integrated circuit packages.

In another form, there is provided semiconductor package and associated method of fabrication. As disclosed, the semiconductor package includes a substrate having first and second surfaces attached to a die having first and second surfaces, where the first surface of the die is attached to the first surface of the substrate. There may also be an array of solder balls attached to the second surface of the substrate to make electrical connection to the die via conductive traces formed in the substrate. The semiconductor package also includes a thermally conductive interface layer formed on the second surface of the die, where the thermally conductive interface layer may be formed as patterned layer of compliant, thermally conductive grease or non-curing silicon material. In addition, the semiconductor package includes a heat spreader lid having a first surface and an exposed heat dissipation surface, where the heat spreader lid may be formed with thermally conductive layer of copper, aluminum or an alloy thereof. One or more recess openings are formed in the first surface of the heat spreader lid to define a recessed pedestal structure and a peripheral extension structure, where the recessed pedestal structure is positioned for direct attachment to the thermally conductive interface layer, and where the recessed pedestal structure and peripheral extension structure define a mold compound cavity in which compression molded compound material is formed to seal the substrate and heat spreader lid. In selected embodiments, the peripheral extension structure may be formed as a recessed lid feet structure disposed peripherally around the recessed pedestal to separate the mold compound cavity from one or more singulation recess openings formed in the heat spreader lid. In other embodiments, the mold compound cavity formed in the heat spreader lid provides sufficient space for wire bond conductors attached to the die when the substrate is clamped to the heat spreader lid. In addition or in the alternative, the recessed pedestal structure has a thermal contact surface that is at least as large as the second surface of the die, thereby maximizing heat dissipation.

In yet another form, there is disclosed a method of making a semiconductor package. As an initial step, a plurality of integrated circuit die is attached to a molded array package ball grid array substrate array to enable electrical connection between each integrated circuit die and conductors in the substrate array. In addition, a thermally conductive interface layer is attached to on an exposed surface of each of the plurality of integrated circuit die. In registry with the substrate array, a heat spreader lid array is provided that is formed with an unlaminated thermally conductive layer having a first surface and a second heat dissipation surface. In the first surface of the heat spreader lid array, a plurality of recess openings are formed to define a plurality of recessed pedestals aligned with the plurality of integrated circuit die, a corresponding plurality of mold compound cavity openings formed around the plurality of recessed pedestals, one or more singulation recess openings formed at least partially through the heat spreader lid array around each of the plurality of recessed pedestals, and one or more perimeter reservoir regions formed in the heat spreader lid array to be connected through one or more openings to the plurality of mold compound cavity openings. On the second heat dissipation surface of the heat spreader lid array, a molding tape layer is attached. Subsequently, the mold compound cavity openings in the heat spreader lid array are partially filled with a mold compound material in a fluid state, and the substrate array is clamped to the heat spreader lid array so that the thermally conductive interface layer on each integrated circuit die makes direct contact with a corresponding recessed pedestals from the heat spreader lid array, thereby partially displacing the mold compound material into one or more perimeter reservoir regions without covering the second heat dissipation surface of the heat spreader lid array with mold compound material. Once clamped, the mold compound material is cured in the mold compound cavity openings to encapsulate the plurality of integrated circuit die and to seal the substrate array to the heat spreader lid array, resulting in an array of molded packages, each having a portion of the substrate array exposed on a first side and a portion of the heat spreader array exposed on a second side. Finally, the array of molded packages may be singulated into a plurality of integrated circuit packages.

Although the described exemplary embodiments disclosed herein are directed to various packaging assemblies and methods for making same, the present invention is not necessarily limited to the example embodiments which illustrate inventive aspects of the present invention that are applicable to a wide variety of packaging processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the process steps may be performed in an alternative order than what is presented. Also, the figures do not show all the details of connections between various elements of the package, since it will be appreciated the leads, vias, bonds and other connection means can be used to effect any electrical connection. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor package, comprising:
a substrate having first and second surfaces;
a die having first and second surfaces, where the first surface of the die is attached to the first surface of the substrate;
a thermally conductive interface layer located on the second surface of the die; and
a heat spreader lid having a first surface and an exposed heat dissipation surface, the heat spreader lid comprising one or more recess openings formed in the first surface to define a recessed pedestal structure and a peripheral lid feet structure extending between the one or more recess openings and the first surface, where the recessed pedestal structure is positioned for direct attachment to the thermally conductive interface layer, and where the recessed pedestal structure and peripheral lid feet structure define a mold compound cavity in which compression molded compound material is located to seal the substrate and heat spreader lid.

2. The semiconductor package of claim 1, further comprising an array of solder balls attached to the second surface of the substrate to make electrical connection to the die via conductive traces formed in the substrate.

3. The semiconductor package of claim 1, where the thermally conductive interface layer comprises a patterned layer of compliant, thermally conductive grease or non-curing silicon material.

4. The semiconductor package of claim 1, where the heat spreader lid includes a thermally conductive layer of copper, aluminum or an alloy thereof.

5. The semiconductor package of claim 1, where the peripheral lid feet structure is formed in the heat spreader lid as a recessed lid feet structure disposed peripherally around the recessed pedestal to separate the mold compound cavity from one or more singulation recess openings formed in the heat spreader lid.

6. The semiconductor package of claim 1, where the mold compound cavity formed in the heat spreader lid provides sufficient space for wire bond conductors attached to the die when the substrate is clamped to the heat spreader lid.

7. The semiconductor package of claim 1, where the recessed pedestal structure has a thermal contact surface that is at least as large as the second surface of the die.

8. The semiconductor package of claim 1, where the peripheral lid feet structure extends further from the exposed heat dissipation surface of the heat spreader lid than the recessed pedestal structure.

9. The semiconductor package of claim 1, where the peripheral lid feet structure extends past the recessed pedestal structure to form a lid feet structure disposed peripherally around the recessed pedestal to provide a thermal conduction path to the substrate.

10. The semiconductor package of claim 1, where the peripheral lid feet structure extends past the recessed pedestal structure to form a lid feet structure that does not extend to contact the substrate, thereby providing a reservoir opening through which mold compound material flows from the one or more recess openings during compression molding.

11. The semiconductor package of claim 1, where the peripheral lid feet structure extends past the recessed pedestal structure to form a lid feet structure that contacts the substrate to facilitate compression molding and prevent damage to the die during compression molding.

12. A lead frame heat spread lid array comprising opposing first and second surfaces with a plurality of recess openings formed in the first surface to define:
an outer seal ring structure in the first surface that is formed peripherally around the lead frame heat spread lid array to provide a mold compound seal ring;
an array of pedestal lids recessed from the first surface by a first specified distance, each pedestal lid surrounded by a pedestal recess opening that is recessed from the first surface by a second specified distance that is larger than the first specified distance; and
an array of peripheral extension structures recessed from the first surface by a third specified distance that is smaller than the first specified distance, each peripheral extension structure surrounding a corresponding pedestal recess opening to provide a seal reservoir for overflow mold compound material.

13. The lead frame heat spread lid array of claim 12, comprising a copper sheet where the plurality of recess openings are machined, stamped, or etched into the copper sheet.

14. The lead frame heat spread lid array of claim 12, where the outer seal ring structure, array of pedestal lids, and array of peripheral extension structures are formed with a thermally conductive layer of copper, aluminum or an alloy thereof.

15. The lead frame heat spread lid array of claim 12, further comprising an arrayed pattern of recessed saw singulation recesses formed in each peripheral extension structure.

16. The lead frame heat spread lid array of claim 12, where each pedestal lid is sized to match a specified size for a die to be attached to the pedestal lid.

17. The lead frame heat spread lid array of claim 12, where each pedestal lid is sized to be smaller than a specified size for a die to be attached to the pedestal lid.

18. The lead frame heat spread lid array of claim 12, where each pedestal lid is sized to be larger than a specified size for a die to be attached to the pedestal lid.

19. A semiconductor package, comprising:
a lead frame heat spreader comprising opposing first and second surfaces with one or more recess openings formed in the first surface to define:
a pedestal lid recessed from the first surface by a first specified distance and surrounded by a pedestal recess opening that is recessed from the first surface by a second specified distance that is larger than the first specified distance; and
a peripheral extension structure recessed from the first surface by a third specified distance that is smaller than the first specified distance, the peripheral extension structure surrounding the pedestal recess opening;
a ball grid array substrate;
a die having first and second surfaces, where the first surface of the die is attached to the ball grid array substrate with a plurality of flip chip bumps;
a thermally conductive interface layer located on the second surface of the die to make direct contact between the die and the pedestal lid of the lead frame heat spreader, thereby partially displacing the liquid mold compound into the plurality of recess openings; and
where the pedestal lid and peripheral extension structure define a mold compound cavity in which compression molded compound material is located to seal the ball grid array substrate and lead frame heat spreader.

20. The semiconductor package of claim 19, where the pedestal lid and peripheral extension structure are formed with a thermally conductive layer of copper, aluminum or an alloy thereof where the one or more recess openings are machined, stamped, or etched into the thermally conductive layer of copper, aluminum or an alloy thereof.

\* \* \* \* \*